United States Patent
Chen et al.

(10) Patent No.: US 6,271,089 B1
(45) Date of Patent: Aug. 7, 2001

(54) METHOD OF MANUFACTURING FLASH MEMORY

(75) Inventors: Way-Ming Chen, Tainan; Richard Chang, Hsinchu, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/433,955

(22) Filed: Nov. 4, 1999

(51) Int. Cl.⁷ .............................................. H01L 21/8247
(52) U.S. Cl. ............................ 438/264; 438/267; 438/304
(58) Field of Search ................................... 438/257, 264, 438/266, 267, 283, 304, 596

(56) References Cited

U.S. PATENT DOCUMENTS

| | | | |
|---|---|---|---|
| 5,556,799 | * | 9/1996 | Hong ..................................... 438/264 |
| 5,612,237 | * | 3/1997 | Ahn ....................................... 438/467 |
| 6,103,573 | * | 8/2000 | Harari et al. .......................... 438/264 |

\* cited by examiner

*Primary Examiner*—Chandra Chaudhari
(74) *Attorney, Agent, or Firm*—Charles C. H. Wu; Charles C.H. Wu & Associates

(57) ABSTRACT

A method of manufacturing a flash memory having a dual floating gate structure. A source/drain region is formed in a substrate. A first conductive layer is formed on the substrate and between the source/drain region. A first dielectric layer is located between the substrate and the first conductive layer. A floating gate mask is formed on the substrate and the first conductive layer to expose a portion of the first conductive layer. The portion of the first conductive layer and a portion of the first dielectric layer beneath the exposed conductive layer are removed. The floating gate mask is removed. A conformal second dielectric layer and a second conductive layer are formed over the substrate in sequence. The second conductive layer and the second dielectric layer are formed to respectively form a control gate and a third dielectric layer.

8 Claims, 1 Drawing Sheet

METHOD OF MANUFACTURING FLASH MEMORY

BACKGROUND OF THE INVENTION

1. Field of Invention

The present invention relates to a method of manufacturing a flash memory. More particularly, the present invention relates to a method of manufacturing a flash memory having a dual floating gate structure.

2. Description of Related Art

A conventional flash memory is a type of erasable programmable read-only memory (EPROM), which in turn is a type of non-volatile memory. In general, an EPROM cell comprises two gates. One of the gates, known as a floating gate, is fabricated from polysilicon and is used for charge storage. The second gate, known as the control gate, is used for controlling the input and output of data. The floating gate is located beneath the control gate, and is generally in a floating state because there is no connection with external circuits. The control gate is normally wired to the word line. One of the advantages of flash memory is its capacity for block-by-block memory erasure. Furthermore, the speed of memory erase is fast, and normally takes just 1 to 2 seconds for the complete removal of a whole block of memory. For most other EPROM, memory erasure can take up to several minutes due to its bit-by-bit operation.

FIG. 1 is schematic, cross-sectional views of a conventional flash memory. The conventional flash memory is constructed with a floating gate transistor. A tunneling oxide layer 102 is formed on a P-type substrate 100. A floating gate 104 is formed on the tunneling oxide layer 102 and a control gate 108 is formed over the floating gate 104. A dielectric layer 106 is formed between the floating gate 104 and the control gate 108 and encloses the floating gate 104. Therefore, the floating gate 104 is electrically isolated from the environment. Additionally, an N-type drain region and an N-type source region 112 are respectively formed in the substrate 100 adjacent to a portion of the substrate 100 beneath the tunneling oxide layer 102.

Basing on the Flowler-Nordheim effect, during data storage, a voltage of about 8V is applied between the drain region 110 and the source region 112 and a relatively high voltage is applied on the control gate 108. Hence, the hot electrons flow from the source region 112 into the floating gate 104 and penetrate through the tunneling oxide layer 102 near the drain region 110. Therefore, the critical voltage of the floating gate transistor is increased and the object of data storage is achieved.

While erasing the data stored in the flash memory, a proper negative voltage is applied on the control gate 108. Therefore, the electrons captured in the floating gate 108 escape from the floating gate 108 and penetrate through the tunneling oxide layer 102. After that, the data previously stored in the flash memory are erased and the floating gate transistor is restored to the state before the data were stored in the flash memory.

At this time, each flash memory cell can store only one bit. In order to meets storage requirements, that is, to enlarge the numbers of bits stored in a unit area of a flash memory cell, the typical flash memory manufacturing technique is to increase the numbers of bits stored in the unit area of a flash memory.

SUMMARY OF THE INVENTION

The invention provides a method of manufacturing a flash memory having a dual floating gate structure. A substrate is provided. A source/drain region is formed in the substrate. A first conductive layer is formed on the substrate between the source/drain region. A first dielectric layer is located between the substrate and the first conductive layer. A floating gate mask is formed on the substrate and the first conductive layer to expose a portion of the first conductive layer. The portion of the first conductive layer and a portion of the first dielectric layer beneath the exposed conductive layer are removed. The floating gate mask is removed. A conformal second dielectric layer and a second conductive layer are formed over the substrate in sequence. The second conductive layer and the second dielectric layer are formed to respectively form a control gate and a third dielectric layer.

In the present invention, the first conductive layer is separated into two floating gates with the floating gate mask. The source/drain region, the remaining first dielectric layer, the remaining conductive layer, the third dielectric layer and the control gate together form a flash memory having a dual floating gate structure. The remaining conductive layer is transformed into two floating gates. Because each of the floating gates can store one bit, the numbers of bits stored in the unit area is increased. Moreover, the size of the floating gates and the distance therebetween can be adjusted according to the requirements of the product.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
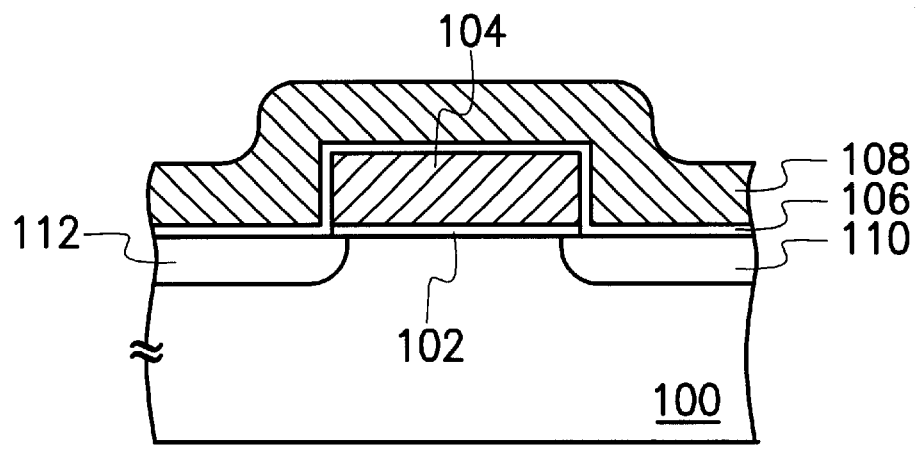
FIG. 1 is schematic, cross-sectional views of a conventional flash memory.
Figure 2A:
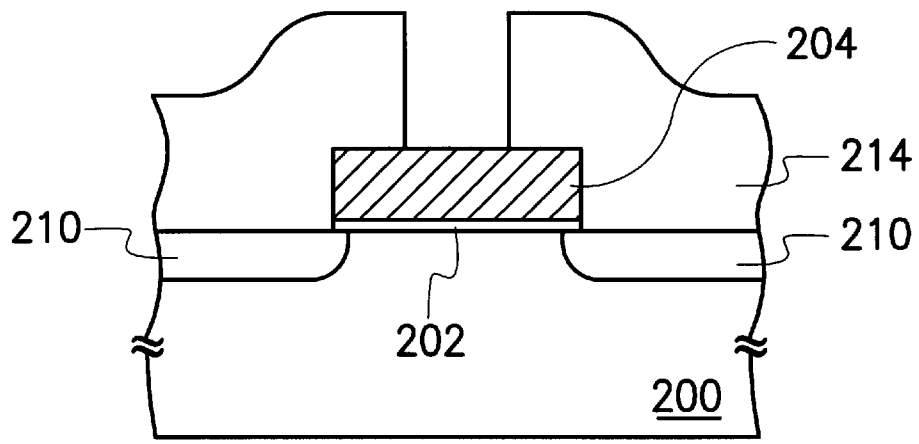
FIGS. 2A through 2B are schematic, cross-sectional views of the process for manufacturing a flash memory having a dual floating gate structure.
Figure 2B:
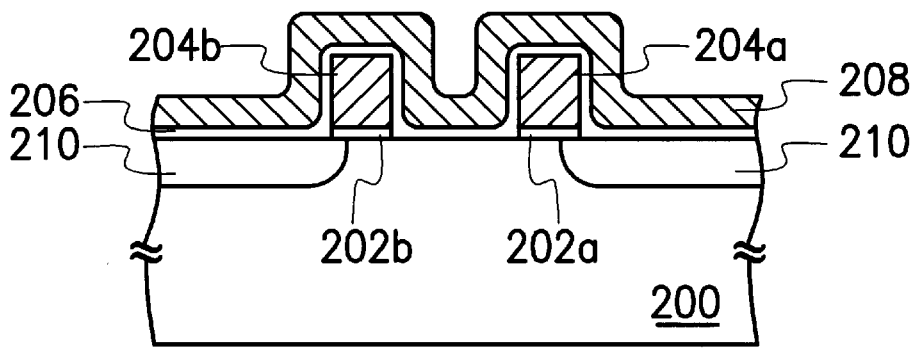

FIGS. 2A through 2B are schematic, cross-sectional views of the process for manufacturing a flash memory having a dual floating gate structure.

As shown in FIG. 2A, a patterned dielectric layer 202 and a conductive layer 204 formed on the patterned dielectric layer 202 are located on a substrate 200. Incidentally, a source/drain region 210 is formed in the substrate 200 adjacent to a portion of the substrate 200 beneath the patterned dielectric layer 202.

The method for manufacturing the source/drain region 210, the patterned dielectric layer 202 and the conductive layer 204 comprises the steps of forming a patterned photoresist (not shown) that exposes a portion of the substrate 200 predetermined for forming a source/drain region. Then, an ion implanting process is performed to form the source/drain region 210, wherein the ions implanted into the substrate 200 can be arsenic ions. After that, the patterned photoresist is removed and a dielectric layer (not shown) and a conductive layer (not shown) are formed on the substrate 200 in sequence. Thereafter, a photolithography and etching process is performed to pattern the dielectric layer and the conductive layer to respectively form the patterned dielectric layer 202 and the conductive layer 204. The patterned dielectric layer 202 electrically isolates the conductive layer 204 from the substrate 200. Additionally, the conductive layer 204 can be made of polysilicon, for example.

A floating gate mask 214 is formed on the substrate 200 and the conductive layer 204 and exposes a portion of the conductive layer 204. The floating gate mask 214 can be made of silicon nitride, for example. The position of the portion of the conductive layer 204 exposed by the floating gate mask 214 can be adjusted according to the requirements of the product.

As shown in FIG. 2B, the portion of the conductive layer 204 exposed by the floating gate mask 214 and the portion of the patterned dielectric layer 202 beneath the exposed conductive layer 204 are removed to expose a portion of the substrate 200. Meanwhile, the remaining conductive layer 204 and the remaining dielectric layer 202 are transformed into floating gates 204a and 204b and tunneling oxide layers 202a and 202b. Specifically, the floating gate 204a is located on the tunneling oxide layer 202a and the tunneling oxide layer 202a is located on a portion of the substrate 200 adjacent to one of the source/drain region 210. Similarly, the floating gate 204b is located on the tunneling oxide layer 202b and the tunneling oxide layer 202b is located on a portion of the substrate 200 adjacent to another source/drain region 210. The method of removing the portion of the conductive layer 204 and the dielectric layer 202 can be anisotropic etching, for example. The floating gate mask 204 is removed. Moreover, the size of the floating gates 204a and 204b and the distance therebetween can be adjusted according to the requirements of the product.

A conformal dielectric layer (not shown) and a conductive layer are formed on the substrate 200 in sequence. A photolithography and etching process is performed to pattern the dielectric layer and the conductive layer to form a dielectric layer 206 and a control gate 208. The dielectric layer 206 is located between the floating gate 202a and the control gate 208 and between the floating gate 202b and the control gate 208. The dielectric layer 206 can be made of silicon oxide or silicon nitride, for example. The control gate 208 can be made of polysilicon, for example.

In the present invention, the conductive layer 204 is separated into two floating gates 204a and 204b by performing a photolithography and etching process with the floating gate mask 214. The source/drain region 210, the tunneling oxide layer 202a and 202b, the floating gates 204a and 204b, the dielectric layer 206 and the control gate 208 together form a flash memory having a dual floating gate structure. Because each of the floating gates 204a and 204b can store one bit, the numbers of bits stored in the unit area is increased. Furthermore, the operations of programming and erasing do not interact with each other between both floating gates 204a and 204b. Specifically, when one of the floating gates 204a and 204b is used to perform a data programming operation or a data erasing operation, it will not affect another one of the floating gates 204a and 204b. Moreover, the size of the floating gates 204a and 204b and the distance therebetween can be adjusted according to the requirements of the product.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a flash memory having a dual floating gate structure, comprising the steps of:

providing a substrate having a plurality of source/drain regions formed therein, a first conductive layer formed on the substrate and between the source/drain regions, wherein a first dielectric layer is located between the substrate and the first conductive layer;

forming a floating gate mask on the substrate and the first conductive layer to expose a portion of the first conductive layer;

removing the portion of the first conductive layer and a portion of the first dielectric layer beneath the exposed conductive layer;

removing the floating gate mask;

forming a conformal second dielectric layer and a second conductive layer over the substrate in sequence; and patterning the second conductive layer and the second dielectric layer to form a control gate and a third dielectric layer, respectively.

2. The method of claim 1, wherein the second dielectric layer is made of silicon oxide.

3. The method of claim 1, wherein the second dielectric layer is made of silicon nitride.

4. The method of claim 1, wherein the floating gate mask is made of silicon nitride.

5. A method of manufacturing a flash memory having a dual floating gate structure, comprising the steps of:

providing a substrate having a plurality of source/drain regions formed therein;

forming a first conductive layer formed on the substrate between the source/drain regions, wherein a first dielectric layer is located between the substrate and the first conductive layer;

forming a floating gate mask on the substrate and the first conductive layer to expose a portion of the first conductive layer;

removing the portion of the first conductive layer and a portion of the first dielectric layer beneath the exposed conductive layer until a portion of the substrate between the source/drain regions is exposed, wherein a remaining first conductive layer regarded as a dual floating gate comprising a first floating gate partially covering one source/drain region and a second floating gate partially covering the other source/drain region;

removing the floating gate mask;

forming a conformal second dielectric layer and a second conductive layer over the substrate in sequence; and patterning the second conductive layer and the second dielectric layer to respectively form a control gate and a third dielectric layer.

6. The method of claim 5, wherein the second dielectric layer is made of silicon oxide.

7. The method of claim 5, wherein the second dielectric layer is made of silicon nitride.

8. The method of claim 5, wherein the floating gate mask is made of silicon nitride.

* * * * *